United States Patent
Yamazaki et al.

(10) Patent No.: US 6,242,758 B1
(45) Date of Patent: *Jun. 5, 2001

(54) SEMICONDUCTOR DEVICE EMPLOYING RESINOUS MATERIAL, METHOD OF FABRICATING THE SAME AND ELECTROOPTICAL DEVICE

(75) Inventors: Shunpei Yamazaki, Tokyo; Yasuyuki Arai; Satoshi Teramoto, both of Kanagawa, all of (JP)

(73) Assignee: Semiconductor Energy Laboratory Co., Ltd., Kanagawa-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/955,617

(22) Filed: Oct. 22, 1997

Related U.S. Application Data

(62) Division of application No. 08/575,355, filed on Dec. 20, 1995, now abandoned.

(30) Foreign Application Priority Data

Dec. 27, 1994 (JP) .................................................. 6-339162

(51) Int. Cl.[7] ................................................ H01L 29/04
(52) U.S. Cl. .............................. 257/59; 257/57; 257/72
(58) Field of Search .................................. 257/59, 57, 72

(56) References Cited

U.S. PATENT DOCUMENTS

| | | | |
|---|---|---|---|
| 4,068,020 | 1/1978 | Reuschel | 438/482 |
| 4,103,297 | 7/1978 | McGreivy et al. | 345/90 |
| 4,239,346 | 12/1980 | Lloyd | 349/44 |
| 4,365,013 | 12/1982 | Ishioka et al. | 430/57 |
| 4,378,417 | 3/1983 | Maruyama et al. | 430/57 |
| 4,569,903 | * 2/1986 | Hashiue et al. | 430/350 |
| 4,582,395 | * 4/1986 | Morozumi | 349/43 |
| 4,591,892 | 5/1986 | Yamazaki | 257/458 |
| 4,597,160 | 7/1986 | Ipri | 438/166 |

(List continued on next page.)

FOREIGN PATENT DOCUMENTS

| | | | |
|---|---|---|---|
| 0 161 555 A2 | 11/1985 | (EP) . | |
| 0321073 | 6/1989 | (EP) | 340/784 |
| 49-77537 | 7/1974 | (JP) . | |
| 0144297 | 12/1978 | (JP) | 340/784 |
| 55-32026 | 3/1980 | (JP) . | |
| 60-33863 | 2/1985 | (JP) . | |
| 60-35574 | 2/1985 | (JP) . | |
| 60-66865 | 4/1985 | (JP) . | |
| 61-141174 | 6/1986 | (JP) . | |
| 62-126677 | 6/1987 | (JP) . | |
| 63-100777 | 5/1988 | (JP) . | |
| 1-30272 | 2/1989 | (JP) . | |
| 0068724 | 3/1989 | (JP) | 340/784 |
| 64-68724 | 3/1989 | (JP) . | |
| 1130131 | 5/1989 | (JP) | 340/784 |
| 1-156725 | 6/1989 | (JP) . | |
| 0051129 | 2/1990 | (JP) | 340/784 |

(List continued on next page.)

OTHER PUBLICATIONS

J. J. Licari, "Plastic Coatings For Electronics", McGraw–Hill Book Co., pp. 60–64, Jan. 12, 1971.*

Primary Examiner—Eddie C. Lee
Assistant Examiner—George C. Eckert, II
(74) Attorney, Agent, or Firm—Eric J. Robinson; Nixon Peabody LLP

(57) ABSTRACT

A pair of substrates forming the active matrix liquid crystal display are fabricated from resinous substrates having transparency and flexibility. A thin-film transistor has a semiconductor film formed on a resinous layer formed on one resinous substrate. The resinous layer is formed to prevent generation of oligomers on the surface of the resinous substrate during formation of the film and to planarize the surface of the resinous substrate.

68 Claims, 3 Drawing Sheets

U.S. PATENT DOCUMENTS

| | | | | |
|---|---|---|---|---|
| 4,609,930 | * | 9/1986 | Yamazaki | 257/59 |
| 4,680,580 | | 7/1987 | Kawahara | 345/90 |
| 4,740,829 | | 4/1988 | Nakagiri et al. | 257/65 |
| 4,818,077 | | 4/1989 | Ohwada et al. | 349/34 |
| 4,860,069 | | 8/1989 | Yamazaki | 257/13 |
| 4,862,237 | | 8/1989 | Morozumi | 257/72 |
| 4,868,014 | | 9/1989 | Kanai et al. | 427/248.1 |
| 4,888,305 | | 12/1989 | Yamazaki et al. | 438/482 |
| 4,891,330 | | 1/1990 | Guha et al. | 438/488 |
| 4,897,360 | | 1/1990 | Guckel et al. | 216/2 |
| 4,938,565 | | 7/1990 | Ichikawa | 349/54 |
| 4,949,141 | | 8/1990 | Busta | 349/47 |
| 4,959,700 | | 9/1990 | Yamazaki | 257/61 |
| 4,969,025 | | 11/1990 | Yamamoto et al. | 257/56 |
| 4,969,031 | | 11/1990 | Kobayashi et al. | 257/64 |
| 4,986,213 | | 1/1991 | Yamazaki et al. | 118/719 |
| 5,003,356 | | 3/1991 | Wakai et al. | 257/390 |
| 5,012,228 | | 4/1991 | Masuda et al. | 345/88 |
| 5,051,570 | | 9/1991 | Tsujikawa et al. | 250/201.1 |
| 5,054,887 | * | 10/1991 | Kato et al. | 349/42 |
| 5,055,899 | | 10/1991 | Wakai et al. | 257/61 |
| 5,056,895 | | 10/1991 | Kahn | 349/114 |
| 5,077,223 | | 12/1991 | Yamazaki | 438/87 |
| 5,084,905 | | 1/1992 | Sasaki et al. | 257/776 |
| 5,085,973 | * | 2/1992 | Shimizu et al. | 430/271.1 |
| 5,107,308 | | 4/1992 | Koezuka et al. | 257/40 |
| 5,132,754 | | 7/1992 | Serikawa et al. | 257/57 |
| 5,132,821 | | 7/1992 | Nicholas | 349/43 |
| 5,250,818 | | 10/1993 | Saraswat et al. | 257/66 |
| 5,250,931 | | 10/1993 | Misawa et al. | 345/206 |
| 5,289,300 | | 2/1994 | Yamazaki et al. | 349/42 |
| 5,304,895 | * | 4/1994 | Ujihara | 315/72 |
| 5,327,001 | | 7/1994 | Wakai et al. | 257/350 |
| 5,334,859 | * | 8/1994 | Matsuda | 257/57 |
| 5,346,850 | | 9/1994 | Kaschmitter et al. | 438/487 |
| 5,347,144 | | 9/1994 | Garnier et al. | 257/40 |
| 5,403,756 | | 4/1995 | Yoshinouchi et al. | 438/162 |
| 5,427,961 | | 6/1995 | Takenouchi et al. | 438/96 |
| 5,453,350 | | 9/1995 | Kurachi et al. | 430/527 |
| 5,470,619 | | 11/1995 | Ahn et al. | 427/578 |
| 5,495,353 | | 2/1996 | Yamazaki et al. | 349/43 |
| 5,498,573 | | 3/1996 | Whetten | 438/644 |
| 5,500,537 | | 3/1996 | Tsumura et al. | 257/40 |
| 5,529,951 | | 6/1996 | Noguchi et al. | 438/487 |
| 5,530,265 | | 6/1996 | Takemura | 257/66 |
| 5,535,027 | * | 7/1996 | Kimura et al. | 359/58 |
| 5,541,748 | | 7/1996 | Ono et al. | 349/42 |
| 5,612,799 | | 3/1997 | Yamazaki et al. | 349/42 |
| 5,627,404 | | 5/1997 | Takenouchi et al. | 257/642 |
| 5,631,753 | * | 5/1997 | Hamaguchi et al. | 349/110 |
| 5,677,041 | | 10/1997 | Smayling | 257/66 |
| 5,717,223 | | 2/1998 | Hack et al. | 257/57 |
| 5,717,224 | | 2/1998 | Zhang | 257/57 |
| 5,744,818 | | 4/1998 | Yamazaki et al. | 257/57 |
| 5,776,803 | | 7/1998 | Young | 438/149 |
| 6,049,364 | | 4/2000 | Takahara et al. | 349/10 |

FOREIGN PATENT DOCUMENTS

| | | |
|---|---|---|
| 2 103925 | 4/1990 | (JP) . |
| 2-188723 | 7/1990 | (JP) . |
| 2-210330 | 8/1990 | (JP) . |
| 2-234134 | 9/1990 | (JP) . |
| 4-184424 | 7/1992 | (JP) . |
| 2900229 | 3/1999 | (JP) . |

* cited by examiner

US 6,242,758 B1

SEMICONDUCTOR DEVICE EMPLOYING RESINOUS MATERIAL, METHOD OF FABRICATING THE SAME AND ELECTROOPTICAL DEVICE

This is a Divisional application of Ser. No. 08/575,355, filed Dec. 20, 1995 now abandoned.

BACKGROUND OF THE INVENTION

1. Field of the Invention

The present invention relates to a configuration of thin-film transistors (TFTS) formed on a flexible substrate (i.e., having mechanical flexibility) such as a resinous substrate which can be made of engineering plastics. The invention also relates to a method of fabricating such thin-film transistors. Furthermore, the invention relates to an active matrix liquid crystal display fabricated, using these thin-film transistors.

2. Prior Art

Thin-film transistors formed on glass substrates or on quartz substrates are known. Thin-film transistors formed on glass substrates are chiefly used in active matrix liquid crystal displays. Since active matrix liquid crystal displays can display images with high response and with high information content, it is expected that they can supplant simple matrix liquid crystal displays.

In an active matrix liquid crystal display, one or more thin-film transistors are disposed as a switching element at each pixel. Electric charge going in and out of the pixel electrode is controlled by this thin-film transistor. The substrates are made of glass or quartz, because it is necessary that visible light pass through the liquid crystal display.

Liquid crystal displays are display means which are expected to find quite extensive application. For example, they are expected to be used as display means for card-type computers, portable computers, and portable electronic devices for various telecommunication appliances. As more sophisticated information is treated, more sophisticated information is required to be displayed on the display means used for these portable electronic devices. For example, there is a demand for functions of displaying higher information content and moving pictures as well as numerals and symbols.

Where a liquid crystal display is required to have a function of displaying higher information content and moving pictures, it is necessary to utilize an active matrix liquid crystal display. However, where substrates made of glass or quartz are used, various problems take place: (1) limitations are imposed on thinning of the liquid crystal display itself; (2) the weight is increased; (3) if the thickness is reduced in an attempt to reduce the weight, the substrate breaks; and (4) the substrate lacks flexibility.

Especially, card-type electronic devices are required to be so flexible that they are not damaged if slight stress is exerted on them when they are treated. Therefore, liquid crystal displays incorporated in these electronic devices are similarly required to be flexible.

The invention disclosed herein provides an active matrix liquid crystal display having flexibility.

SUMMARY OF THE INVENTION

One available method of imparting flexibility to a liquid crystal display is to use plastic or resinous substrates which transmit light. However, because of poor heat resistance of resinous substrates, it is technically difficult to form thin-film transistors on them.

Accordingly, the invention disclosed herein solves the foregoing difficulty by adopting the following configuration:

One invention disclosed herein comprises: a filmy resinous substrate; a resinous layer formed on a surface of said resinous substrate; and thin-film transistors formed on said resinous layer.

A specific example of the above-described configuration is shown in FIG. 1. In the configuration shown in FIG. 1, a resinous layer 102 is in contact with a PET film 101 having a thickness of 100 $\mu$m, the PET film being a filmy resinous substrate. Inverted-staggered thin-film transistors are formed on the resinous layer.

The material of the filmy resinous substrate can be selected from PET (polyethylene terephthalate), PEN (polyethylene naphthalate), PES (polyethylene sulfite), and polyimide. The requirements are flexibility and transparency. Preferably, the maximum temperature that the material can withstand is made as high as possible. If the heating temperature is elevated above 200° C., oligomers (polymers having diameters of about 1 $\mu$m) are generally deposited on the surface, or gases are produced. Therefore, it is quite difficult to form a semiconductor layer on the resinous substrate. Consequently, the material should have the highest possible processing temperature.

In the above-described structure, the resinous layer acts to planarize the surface of the resinous substrate. The planarization also serves to prevent precipitation of oligomers on the surface of the resinous substrate during steps involving heating such as the step for forming the semiconductor layer.

The material of this resinous layer can be selected from methyl esters of acrylic acid, ethyl esters of acrylic acid, butyl esters of acrylic acid, and 2-ethylhexyl esters of acrylic acid. Even if resinous substrates are used, this resinous layer can suppress the drawbacks with fabrication of the aforementioned thin-film transistors.

The configuration of another invention comprises the steps of: forming a resinous layer on a filmy resinous substrate; forming a semiconductor layer on said resinous layer by plasma-assisted CVD; and forming thin-film transistors, using said semiconductor layer.

The configuration of a further invention comprises the steps of: heat-treating a filmy resinous substrate at a given temperature to degas said resinous substrate; forming a resinous layer on the filmy resinous substrate; forming a semiconductor layer on said resinous substrate by plasma-assisted CVD; and forming thin-film transistors, using said semiconductor layer.

In the above-described structure, heat-treatment is made to degas the resinous substrate, in order to prevent escape of gases from the resinous substrate during later processes involving heating. For example, if gases are released from the resinous substrate when a semiconductor thin film is being formed on the resinous substrate, then large pinholes are formed in the semiconductor thin film. This greatly impairs the electrical characteristics. Accordingly, the substrate is heat-treated at a temperature higher than heating temperatures used in the later processes, to degas the resinous substrate. In this way, release of gases from the resinous substrate during the later steps can be suppressed.

The configuration of a yet other invention comprises the steps of: heat-treating a filmy resinous substrate at a given temperature; forming a resinous layer on said filmy resinous substrate; forming a semiconductor layer on said resinous substrate by plasma-assisted CVD while heating the substrate to a temperature lower than said given temperature; and forming thin-film transistors, using said semiconductor layer.

The configuration of a still other invention comprises the steps of: heat-treating a filmy resinous substrate at a given temperature which is higher than any heat-treatment temperature used in other steps; forming a resinous layer on said filmy resinous substrate; forming a semiconductor layer on said resinous substrate by plasma-assisted CVD; and forming thin-film transistors, using said semiconductor layer.

The configuration of a still further invention comprises: a pair of filmy resinous substrates; a liquid crystal material held between said resinous substrates; pixel electrodes formed on a surface of at least one of said resinous substrates; thin-film transistors connected with said pixel electrodes and formed on said resinous substrate; and resinous layers formed on surfaces of said filmy resinous substrates to planarize the surfaces.

A specific example of the above-described structure is shown in FIG. 3. In the structure shown in FIG. 3, a pair of resinous substrates 301, 302, a liquid crystal material 309 held between these resinous substrates, pixel electrodes 306, thin-film transistors (TFTs) 305 connected with the pixel electrodes 306, and a resinous layer 303 for planarizing the surface of the resinous substrate 301.

DETAILED DESCRIPTION OF THE PREFERRED EMBODIMENTS

EXAMPLE 1

Figure 1:
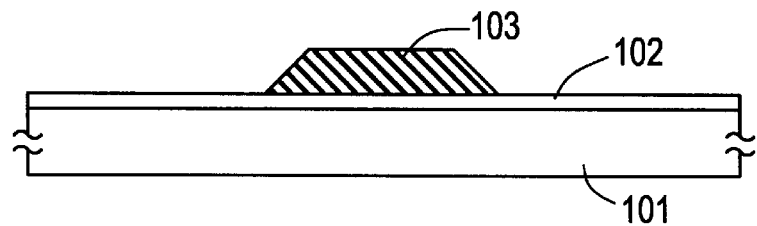
FIGS. 1(A) to 1(E) are views illustrating a process sequence for fabricating thin-film transistors according to the present invention.

The present example shows an example in which inverted-staggered TFTs are formed on a substrate of PET (polyethylene terephthalate) which is an organic resin.

As shown in FIG. 1(A), a PET film 101 having a thickness of 100 μm is first prepared and heat-treated to degas the film. This heat-treatment is required to be conducted at a temperature higher than the highest temperature applied in later processes. In the processes shown in the present example, a temperature of 160° C. used during formation of an amorphous silicon film by plasma-assisted CVD is the highest heating temperature. Therefore, the heat-treatment for degassing the PET film is performed at 180° C.

A layer of an acrylic resin 102 is formed on this PET film 101. As an example, a methyl ester of acrylic acid can be used as the acrylic resin. This acrylic resin layer 102 acts to prevent precipitation of oligomers on the surface of the PET film 101 in processes conducted later. The acrylic resin layer 102 also serves to planarize the uneven surface of the PET film 102. Generally, PET film surface has unevenness of the order of several hundreds of angstroms to 1 μm. Such unevenness greatly affects the electrical properties of the semiconductor layer having a thickness of several hundreds of angstroms. Therefore, it is quite important to planarize the base on which the semiconductor layer is formed.

Then, gate electrodes 103 of aluminum are formed. The gate electrodes 103 are formed by forming an aluminum film to a thickness of 2000 to 5000 Å (3000 Å in this example) by sputtering and performing a well-known patterning step making use of photolithography. The gate electrodes 103 are etched so that the side surfaces are tapered (FIG. 1(A)).

Thereafter, a silicon oxide film acting as a gate-insulating film 104 is formed to a thickness of 1000 Å by sputtering. The gate-insulating film 104 may be made from silicon nitride instead of silicon oxide.

Subsequently, a substantially intrinsic (I-type) amorphous silicon film 105 is formed to a thickness of 500 Å by plasma-assisted CVD under the following conditions:

film formation temperature
  (at which the substrate is heated): 160° C.
reaction pressure: 0.5 torr
RF power (13.56 MHz): 20 mW/cm$^2$
reactant gas: $SiH_4$ In this example, the film is formed, using a parallel-plate plasma-CVD machine. The substrate is heated by a heater disposed within a substrate stage in which the resinous substrate is placed. In this way, the state shown in FIG. 1(B) is obtained.

Then, a silicon oxide film which acts as an etch stopper in a later step is formed by sputtering and then patterned to form an etch stopper 106.

Thereafter, an n-type amorphous silicon film 107 is formed to a thickness of 300 Å by parallel-plate plasma-assisted CVD under the following conditions:

film formation temperature
  (at which the substrate is heated): 160° C.
reaction pressure: 0.5 torr
RF power (13.56 MHz): 20 mW/cm$^2$
reactant gases: $B_2H_6/SiH_4$=1/100

Figure 1B:
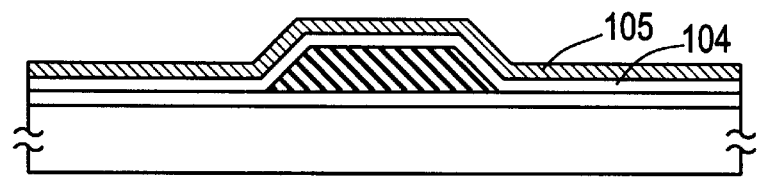
Figure 1C:
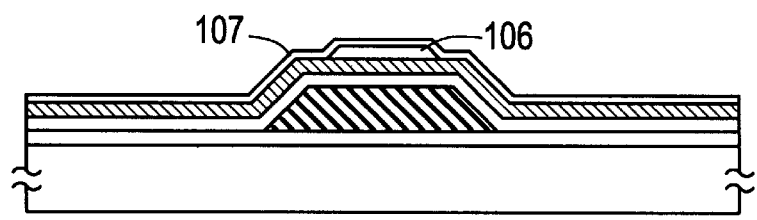
Figure 1D:
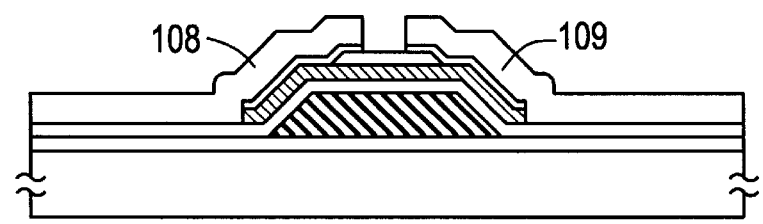

In this way, the state shown in FIG. 1(C) is obtained. Then, the n-type amorphous silicon film 107 and the substantially intrinsic (I-type) amorphous silicon film 105 are patterned by a dry-etching process. An aluminum film is formed to a thickness of 3000 Å by sputtering techniques. Thereafter, this aluminum film and the underlying n-type amorphous silicon film 107 are etched to form source electrodes 108 and drain electrodes 109. During this etching process, the action of the etch stopper 106 assures that the source and drain regions are isolated from each other (FIG. 1(D)).

Figure 1E:
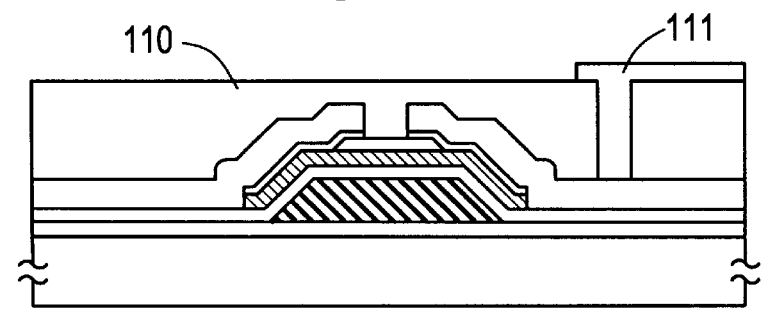

An interlayer dielectric layer 110 is formed out of a resinous material such as silicon oxide or polyimide to a thickness of 6000 Å. Where a silicon oxide film is formed, a liquid which is applied when the silicon oxide film is formed may be used. Finally, contact holes are formed, and pixel electrodes 111 are fabricated from ITO. In this way, thin-film transistors arranged at the pixel electrodes of the active matrix liquid crystal display can be fabricated, using the transparent resinous substrate (FIG. 1(E)).

EXAMPLE 2

The present example shows a case in which an active matrix liquid crystal display is fabricated, using the thin-film transistors described in Example 1. The liquid crystal electrooptical device described in the present example is shown in FIG. 3 in cross section.

Figure 3:
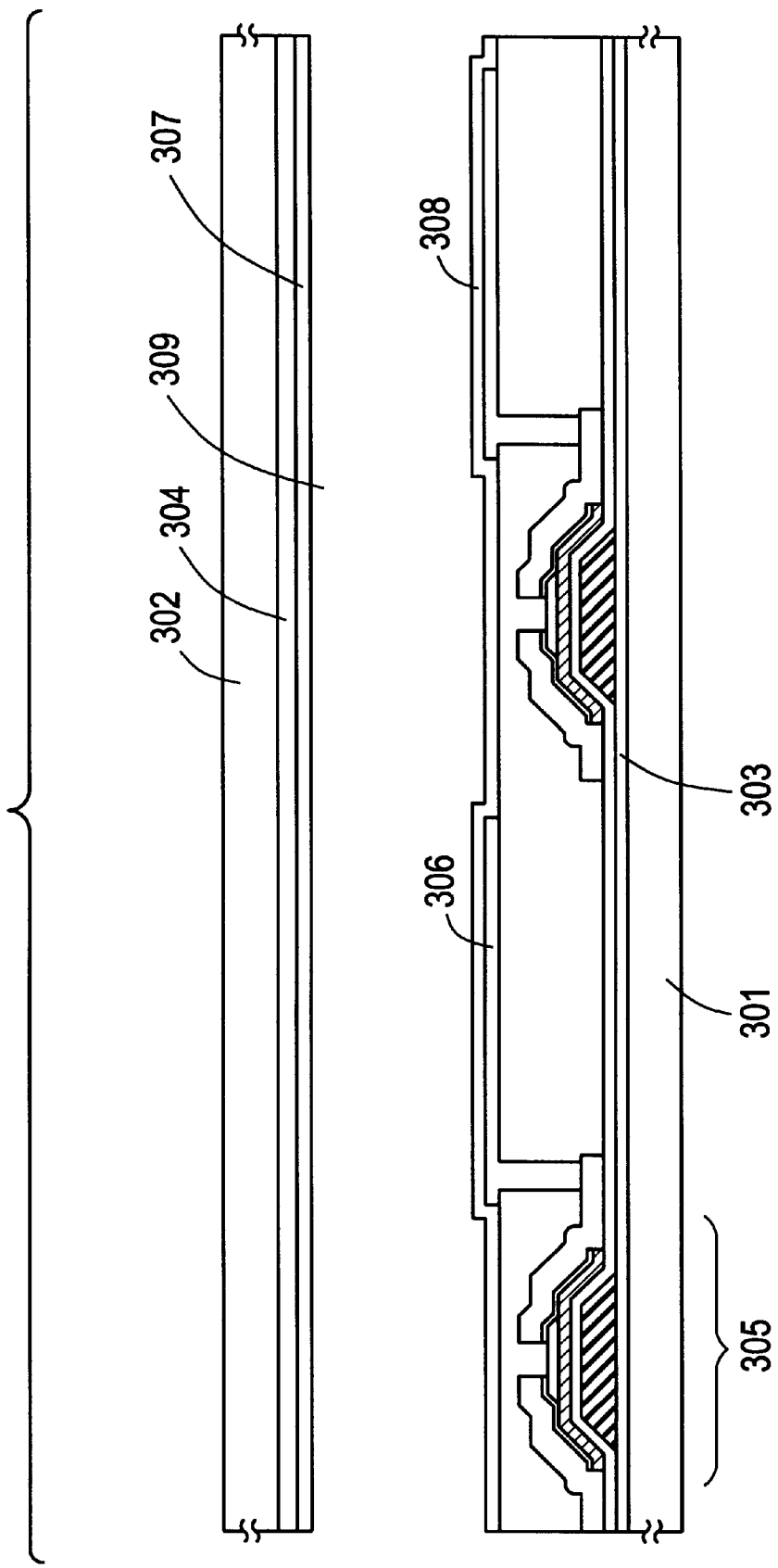
FIG. 3 is a schematic cross-sectional view of a liquid crystal panel.

In FIG. 3, PET films 301 and 302 having a thickness of 100 μm form a pair of substrates. An acrylic resin layer 303 acts as a planarizing layer. Indicated by 306 are pixel electrodes. In FIG. 3, only the structure corresponding to two pixels is shown.

Indicated by 304 is a counter electrode. Orientation films 307 and 308 orient a liquid crystal 309 which can be a twisted-nematic (TN) liquid crystal, supertwisted-nematic (STN) liquid crystal, or a ferroelectric liquid crystal. Generally, a TN liquid crystal is employed. The thickness of the liquid crystal layer is several micrometers to about 10 μm.

Thin-film transistors (TFTs) 305 are connected with the pixel electrodes 306. Electric charge going in and out of the pixel electrodes 306 is controlled by the TFTs 305. In this example, only one of the pixel electrodes 306 is shown as a typical one but a required number of other configurations of similar structure are also formed.

In the structure shown in FIG. 3, the substrates 301 and 302 have flexibility and so the whole liquid crystal panel can be made flexible.

EXAMPLE 3

Figure 2A:
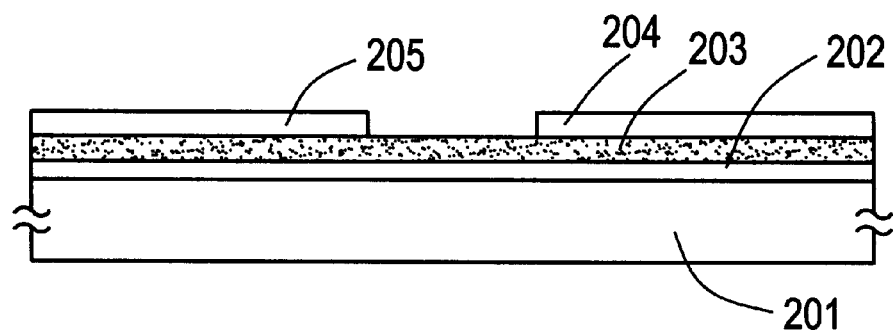
FIGS. 2(A) to 2(C) are views illustrating another process sequence for fabricating thin-film transistors according to the present invention.
Figure 2B:
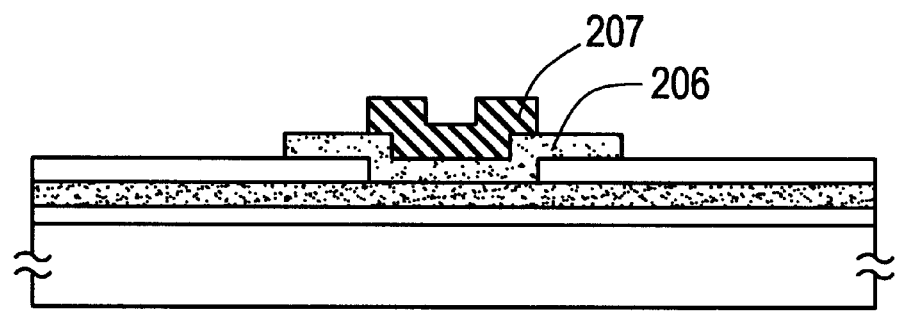
Figure 2C:
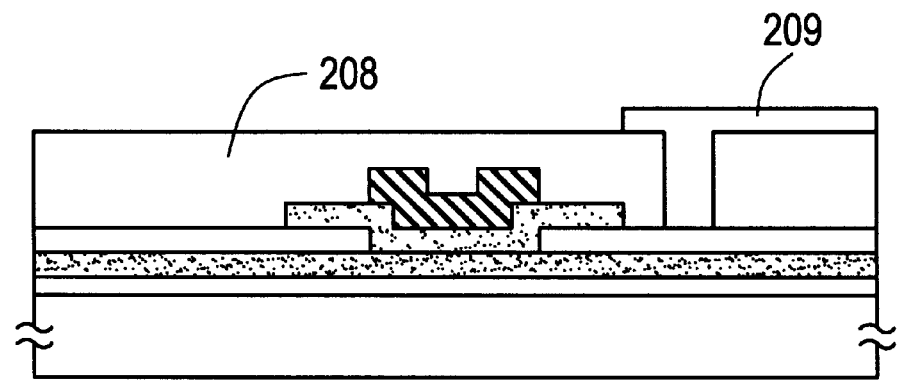

The present example shows an example in which coplanar thin-film transistors used for an active matrix liquid crystal display are fabricated. The process sequence for fabricating the thin-film transistors of the present example is shown in FIG. 2. First, a PET film 201 having a thickness of 100 μm is prepared as a filmy organic resin substrate. The film is heated-treated at 180° C. to promote degassing from the PET film 201. A layer of an acrylic resin 202 is formed on the surface of the film. In this example, an ethyl ester of acrylic acid is used as the acrylic resin.

Then, a substantially intrinsic (I-type) semiconductor layer 203 in which a channel formation region is formed is grown by plasma-assisted CVD under the following conditions:

film formation temperature
(at which the substrate is heated): 160° C.
reaction pressure: 0.5 torr
RF power (13.56 MHz): 20 mW/cm$^2$
reactant gas: SiH$_4$ In this example, a parallel-plate plasma-CVD machine is used to grow the film.

Then, an n-type amorphous silicon film is grown to a thickness of 300 Å by the parallel-plate plasma-CVD machine under the following conditions:

film formation temperature
(at which the substrate is heated): 160° C.
reaction pressure: 0.5 torr
RF power (13.56 MHz): 20 mW/cm$^2$
reactant gases: B$_2$H$_6$/SiH$_4$=$^1$/$_{100}$ The n-type amorphous silicon film is patterned to form source regions 205 and drain regions 204 (FIG. 2(A)).

A silicon oxide film or silicon nitride film acting as a gate-insulating film is formed by sputtering techniques and patterned to form the gate-insulating film 206. Gate electrodes 207 are then formed from aluminum (FIG. 2(B)).

A polyimide layer 208 is formed as an interlayer dielectric film to a thickness of 5000 Å. Contact holes are formed. ITO electrodes 209 becoming pixel electrodes are formed by sputtering, thus completing TFTs (FIG. 2(C)).

EXAMPLE 4

The present example is similar to the structure of Example 1 or 2 except that the semiconductor layer is made of a microcrystalline semiconductor film. First, a substantially intrinsic semiconductor layer is grown as the microcrystalline semiconductor layer under the following conditions:

film formation temperature
(at which the substrate is heated): 160° C.
reaction pressure: 0.5 torr
RF power (13.56 MHz): 150 mW/cm$^2$
reactant gases: SiH$_4$/H$_2$=$^1$/$_{30}$ In this example, a parallel-plate plasma-CVD machine is used to grow the film.

The conditions under which an n-type microcrystalline silicon film is grown are described below. Also in this case, a parallel-plate plasma-CVD machine is used.

film formation temperature
(at which the substrate is heated): 160° C.
reaction pressure: 0.5 torr
RF power (13.56 MHz): 150 mW/cm$^2$
reactant gases: B$_2$H$_6$/SiH$_4$=$^1$/$_{100}$ Generally, a microcrystalline silicon film can be obtained by supplying power of 100 to 200 mW/cm$^2$. In the case of the I-type semiconductor layer, desirable results are obtained by diluting silane with hydrogen by a factor of about 10 to 50, as well as by increasing the power. However, if the hydrogen dilution is made, the film growth rate drops.

EXAMPLE 5

The present example relates to a method consisting of irradiating a silicon film with laser light having such a power that the filmy base or substrate is not heated, the silicon film having been formed by plasma-assisted CVD as described in the other examples.

A technique for changing an amorphous silicon film formed on a glass substrate into a crystalline silicon film by irradiating the amorphous film with laser light (e.g., KrF excimer laser light) is known. In another known technique, impurity ions for imparting one conductivity type are implanted into the silicon film and then the silicon film is irradiated with laser light to activate the silicon film and the impurity ions. The implantation of the impurity ions amorphizes the silicon film.

The configuration described in the present example makes use of a laser irradiation process as described above, and is characterized in that the amorphous silicon film 105 shown in FIG. 1 or the amorphous silicon films 203 and 204 shown in FIG. 2 are irradiated with quite weak laser light to crystallize the amorphous silicon film. If the previously formed film is a microcrystalline silicon film, the crystallinity can be improved.

KrF excimer laser or XeCl excimer laser can be used to emit the laser light. The energy of the emitted laser light is 10 to 50 mJ/cm$^2$. It is important that the resinous substrate 101 or 102 be not thermally damaged.

By utilizing the invention disclosed herein, the thickness of an active matrix liquid crystal display can be reduced. Also, the weight can be decreased. If an external force is applied, the substrates do not break. Flexibility can be imparted to the display.

This liquid crystal display can find wide application and is quite useful.

What is claimed is:

1. A semiconductor device comprising:
   a resinous substrate;
   a resinous layer on said resinous substrate for planarizing a surface of the substrate;
   a gate electrode on said resinous layer;
   a gate insulating layer on said gate electrode;
   a semiconductor layer on said gate insulating layer, said semiconductor layer having at least a channel region;
   an etch stopper on said semiconductor layer;
   a source and a drain on said semiconductor layer with said etch stopper interposed therebetween;

an interlayer insulating film comprising a resinous material over said etch stopper and said source and said drain, said interlayer insulating film having a leveled surface;

a pixel electrode on said leveled surface of said interlayer insulating film.

2. The device of claim 1 wherein said substrate comprises a material selected from the group consisting of polyethylene terephthalate, polyethylene naphthlate, polyethylene sulfite and polyimide.

3. The device of claim 1 wherein said material of said resinous layer is selected from the group consisting of methyl esters of acrylic acid, ethyl esters of acrylic acid, butyl esters of acrylic acid, and 2-ethylhexyl esters of acrylic acid.

4. The device of claim 1, wherein said semiconductor layer is substantially intrinsic.

5. The device of claim 1, wherein said interlayer insulating film comprises polyimide.

6. The device of claim 1, wherein said semiconductor device is flexible.

7. A semiconductor device comprising:

a resinous substrate;

a resinous layer on said substrate;

a gate electrode over said resinous layer;

a gate insulating layer on said gate electrode;

an amorphous semiconductor layer on said gate insulating layer, said semiconductor layer having at least a channel region;

an etch stopper on said semiconductor layer;

a source electrode and a drain electrode on said semiconductor layer with said etch stopper interposed therebetween;

an interlayer insulating film comprising a resinous material over said etch stopper and said source and said drain, said interlayer insulating film having a leveled surface;

a pixel electrode on said leveled surface of said interlayer insulating film; and an orientation film on said pixel electrode.

8. The device of claim 7 wherein said substrate comprises a material selected from the group consisting of polyethylene terephthalate, polyethylene naphthlate, polyethylene sulfite and polyimide.

9. The device of claim 7 wherein said interlayer insulating film comprises polyimide.

10. The device of claim 7 wherein said etch stopper comprises silicon oxide.

11. The device of claim 7, wherein said semiconductor layer is substantially intrinsic.

12. The device of claim 7, wherein said semiconductor device is a liquid crystal display device.

13. The device of claim 7, wherein said semiconductor device is flexible.

14. A device according to claim 7, wherein said resinous layer has a leveled surface.

15. A semiconductor device comprising:

a resinous substrate;

a resinous layer on said substrate;

a gate electrode over said resinous layer;

a gate insulating layer on said gate electrode;

a semi conductor layer on said gate insulating layer, said semiconductor layer having at least a channel region;

an etch stopper said semiconductor layer;

a source and a drain on said semiconductor layer with said each stopper interposed therebetween;

an interlayer insulating film comprising a resinous material over said etch stopper and said source and said drain, said interlayer insulating film having a leveled surface; and a pixel electrode on said leveled surface of said interlayer insulating film, wherein said semiconductor layer is a crystalline semiconductor film.

16. The device of claim 15 wherein said substrate comprises a material selected from the group consisting of polyethylene terephthalate, polyethylene naphthlate, polyethylene sulfite and polyimide.

17. The device of claim 15, wherein said semiconductor layer is substantially intrinsic.

18. The device of claim 15, wherein said interlayer insulating film comprises polyimide.

19. The device of claim 15, wherein said semiconductor device is flexible.

20. A device according to claim 15, wherein said resinous layer has a leveled surface.

21. A semiconductor device comprising:

a substrate comprising a resinous material;

a resinous layer on said substrate;

a thin film transistor formed over said resinous layer, said thin film transistor having at least, source, drain and channel regions, a gate electrode adjacent to said channel region with a gate insulating film interposed therebetween;

an interlayer insulating film comprising resinous material formed over said substrate and covering said thin film transistor, said interlayer insulating film having a leveled surface; and a pixel electrode on said leveled surface of said interlayer insulating film, wherein said semiconductor device is flexible.

22. The device of claim 21 wherein said semiconductor device is a liquid crystal display device.

23. The device of claim 21, wherein said thin film transistor comprises said gate electrode formed over said substrate, said gate insulating film formed on said gate electrode, and said channel region formed on said gate insulating film.

24. The device of claim 21, wherein said substrate comprises a material selected from the group consisting of polyethylene terephthalate, polyethylene naphthlate, polyethylene sulfite and polyimide.

25. The device of claim 21, wherein said interlayer insulating film comprises polyimide.

26. The device of claim 21, wherein said thin film transistor is an etch stopper type reversed-stagger thin film transistor.

27. The device of claim 21, wherein said semiconductor layer is substantially intrinsic.

28. A device according to claim 21, wherein said resinous layer has a leveled surface.

29. A semiconductor device comprising:

a substrate comprising a resinous material;

a resinous layer on said substrate for planarizing a surface of the substrate;

a thin film transistor formed over said resinous layer, said thin film transistor having at least, source, drain and channel regions, a gate electrode adjacent to said channel region with a gate insulating film interposed therebetween; and an interlayer insulating film comprising a resinous material formed over said substrate and covering said thin film transistor, said interlayer insulating film having a leveled surface; and a pixel electrode on said leveled surface of said interlayer insulating film.

30. The device of claim 29 wherein said semiconductor device is a liquid crystal display device.

31. The device of claim 29, wherein said thin film transistor comprises said gate electrode formed on said resinous layer, said gate insulating film formed on said gate electrode, and said channel region formed on said gate insulating film.

32. The device of claim 29, wherein said substrate comprises a material selected from the group consisting of polyethylene terephthalate, polyethylene naphthlate, polyethylene sulfite and polyimide.

33. The device of claim 29, wherein said interlayer insulating film comprises polyimide.

34. The device of claim 29, wherein said semiconductor device is flexible.

35. The device of claim 29, wherein said thin film transistor is an etch stopper type reversed-stagger thin film transistor.

36. The device of claim 29, wherein said semiconductor layer is crystalline.

37. A semiconductor device comprising:

a substrate comprising a resinous material;

a resinous layer on said resinous substrate;

a thin film transistor formed over said resinous layer, said thin film transistor having at least, source, drain and channel regions, a gate electrode adjacent to said channel region with a gate insulating film interposed therebetween; and an interlayer insulating film comprising a resinous material formed over said substrate and covering said thin film transistor, wherein said resinous layer comprises a material selected from the group consisting of methyl esters of acrylic acid, ethyl esters of acrylic acid, butyl esters of acrylic acid, and 2-ethylhexyl esters of acrylic acid.

38. The device of claim 37, wherein said semiconductor layer is crystalline.

39. The device of claim 37 wherein said semiconductor device is a liquid crystal display device.

40. The device of claim 37 wherein said thin film transistor comprises said gate electrode formed on said resinous layer, said gate insulating film formed on said gate electrode, and said channel region formed on said gate insulating film.

41. The device of claim 37 wherein said substrate comprises a material selected from the group consisting of polyethylene terephthalate, polyethylene naphthlate, polyethylene sulfite and polyimide.

42. The device of claim 37 wherein said interlayer insulating film comprises polyimide.

43. The device of claim 37 wherein said semiconductor device is flexible.

44. A semiconductor device comprising:

a resinous substrate;

a resinous layer on said resinous substrate;

a gate electrode over said resinous layer;

a gate insulating layer on said gate electrode;

a semiconductor layer on said gate insulating layer, said semiconductor layer having at least a channel region;

a source electrode and a drain electrode on said semiconductor layer; and a resinous material over said source and drain electrodes, wherein material of said resinous layer is different from that of said resinous substrate.

45. A device according to claim 44 wherein said resinous layer comprises a material selected from the group consisting of methyl esters of acrylic acid, ethyl esters of acrylic acid, butyl esters of acrylic acid, and 2-ethylhexyl esters of acrylic acid.

46. A device according to claim 44 wherein said substrate comprises a material selected from the group consisting of polyethylene terephthalate, polyethylene naphthlate, polyethylene sulfite and polyimide.

47. A device according to claim 44 wherein said interlayer insulating film comprises polyimide.

48. A device according to claim 44 wherein said semiconductor device is a liquid crystal display device.

49. A device according to claim 44 wherein said semiconductor device is flexible.

50. A semiconductor device comprising:

a resinous substrate;

a resinous layer on said resinous substrate;

a gate electrode over said resinous layer;

a gate insulating layer on said gate electrode;

an amorphous semiconductor layer on said gate insulating layer, said semiconductor layer having at least a channel region;

a source electrode and a drain electrode on said semiconductor layer; and a resinous material over said source and drain electrodes, wherein material of said resinous layer is different from that of said resinous substrate.

51. A device according to claim 50 wherein said resinous layer comprises a material selected from the group consisting of methyl esters of acrylic acid, ethyl esters of acrylic acid, butyl esters of acrylic acid, and 2-ethylhexyl esters of acrylic acid.

52. A device according to claim 50 wherein said substrate comprises a material selected from the group consisting of polyethylene terephthalate, polyethylene naphthlate, polyethylene sulfite and polyimide.

53. A device according to claim 50 wherein said interlayer insulating film comprises polyimide.

54. A device according to claim 50 wherein said semiconductor device is a liquid crystal display device.

55. A device according to claim 50 wherein said semiconductor device is flexible.

56. A semiconductor device comprising:

a resinous substrate;

a resinous layer on said resinous substrate;

a gate electrode on said resinous layer;

a gate insulating layer on said gate electrode;

a semiconductor layer on said gate insulating layer, said semiconductor layer having at least a channel region;

a source electrode and a drain electrode on said semiconductor layer; and a resinous material over said source and drain electrodes, wherein said semiconductor layer is a crystalline semiconductor film, and wherein material of said resinous layer is different from that of said resinous substrate.

57. A device according to claim 56 wherein said resinous layer comprises a material selected from the group consisting of methyl esters of acrylic acid, ethyl esters of acrylic acid, butyl esters of acrylic acid, and 2-ethylhexyl esters of acrylic acid.

58. A device according to claim 56 wherein said substrate comprises a material selected from the group consisting of polyethylene terephthalate, polyethylene naphthlate, polyethylene sulfite and polyimide.

59. A device according to claim 56 wherein said interlayer insulating film comprises polyimide.

60. A device according to claim 56 wherein said semiconductor device is a liquid crystal display device.

61. A device according to claim 56 wherein said semiconductor device is flexible.

62. A semiconductor device comprising:

a substrate comprising a resinous material;

a resinous layer on said resinous substrate;

a thin film transistor on said resinous layer, said thin film transistor having at least, source, drain and channel regions, a gate electrode adjacent to said channel region with a gate insulating film interposed therebetween; and an interlayer insulating film comprising resinous material formed over said substrate and covering said thin film transistor, wherein material of said resinous layer is different from that of said resinous substrate, and wherein said semiconductor device is flexible.

63. A device according to claim 62 wherein said resinous layer comprises a material selected from the group consisting of methyl esters of acrylic acid, ethyl esters of acrylic acid, butyl esters of acrylic acid, and 2-ethylhexyl esters of acrylic acid.

64. A device according to claim 62 further comprising a pixel electrode formed over said interlayer insulating film and electrically connected to said thin film transistor.

65. A device according to claim 62 wherein said thin film transistor comprises said gate electrode formed over said substrate, said gate insulating film formed on said gate electrode, and said channel region formed on said gate insulating film.

66. A device according to claim 62 wherein said substrate comprises a material selected from the group consisting of polyethylene terephthalate, polyethylene naphthlate, polyethylene sulfite and polyimide.

67. A device according to claim 62 wherein said interlayer insulating film comprises polyimide.

68. A device according to claim 62 wherein said semiconductor device is a liquid crystal display device.

* * * * *